United States Patent [19]

Rivera et al.

[11] Patent Number: 5,111,202
[45] Date of Patent: May 5, 1992

[54] EXTENDED DYNAMIC RANGE QUADRATURE DETECTOR WITH PARALLEL CHANNEL ARRANGEMENT

[75] Inventors: Duveen J. Rivera, Northridge, Calif.; John J. Kotrba, Wichita, Kans.

[73] Assignee: ITT Corporation, New York, N.Y.

[21] Appl. No.: 677,646

[22] Filed: Mar. 28, 1991

[51] Int. Cl.$^5$ .................. H03M 1/18; H03M 1/20; H03D 3/00
[52] U.S. Cl. .................. 341/139; 341/131; 329/345; 375/39
[58] Field of Search ............... 341/139, 155, 126, 131, 341/118, 132, 119; 329/345, 346, 363, 304, 327; 375/38, 39, 102, 77

[56] References Cited

U.S. PATENT DOCUMENTS

| | | | |
|---|---|---|---|
| 3,509,558 | 4/1970 | Cancro | 341/139 X |
| 3,855,589 | 12/1974 | Solender | 341/139 |
| 4,069,479 | 1/1978 | Carpenter et al. | 341/139 |
| 4,129,864 | 12/1978 | Carpenter et al. | 340/347 |
| 4,652,882 | 3/1987 | Shovlin et al. | 342/150 |
| 4,852,123 | 7/1989 | Bickley et al. | 375/9 |
| 4,933,641 | 6/1990 | Hsiung et al. | 328/145 |
| 4,937,579 | 6/1990 | Maio et al. | 341/165 |
| 4,988,951 | 1/1991 | Tomita | 329/345 |
| 4,999,628 | 3/1991 | Kakubo et al. | 341/139 |
| 5,025,455 | 6/1991 | Nguyen | 329/304 X |

Primary Examiner—A. D. Pellinen
Assistant Examiner—Sharon D. Logan
Attorney, Agent, or Firm—David G. Alexander

[57] ABSTRACT

Parallel low-level and high-level quadrature demodulators (60,62) are provided, each including high speed analog-to-digital converters (82,84) with a nominal number of bits. A signal limiter (56) upstream of the low-level demodulator (60) limits the amplitude of an input analog signal (IF IN) to a value corresponding to a predetermined signal level. An attenuator (58) upstream of the high-level demodulator (62) attenuates the input signal (IF IN) by a predetermined factor, so that the signal level into the high-level demodulator (62) is correspondingly lower than the signal level into the low-level demodulator (60). When the amplitude of the input signal (IF IN) is below a predetermined value, a digital switching and scaling unit (72) selects the output signals from the low-level demodulator (60) and extends the digital output to a larger number of bits. When the amplitude of the input signal (IF IN) is above the value corresponding to the maximum amplitude handling capability of the low-level demodulator (60), the switching and scaling unit (72) selects the output signals from the high-level demodulator (62), amplifies them by the predetermined scaling factor to restore their original amplitude, and extends the digital output to the larger number of bits. Thus, the dynamic range of a single detector is extended by a two-channel parallel detector scheme by a value corresponding to the attenuation/scaling factor used. The demodulators (60,62) may be of the analog or direct-digital-sampling type.

11 Claims, 4 Drawing Sheets

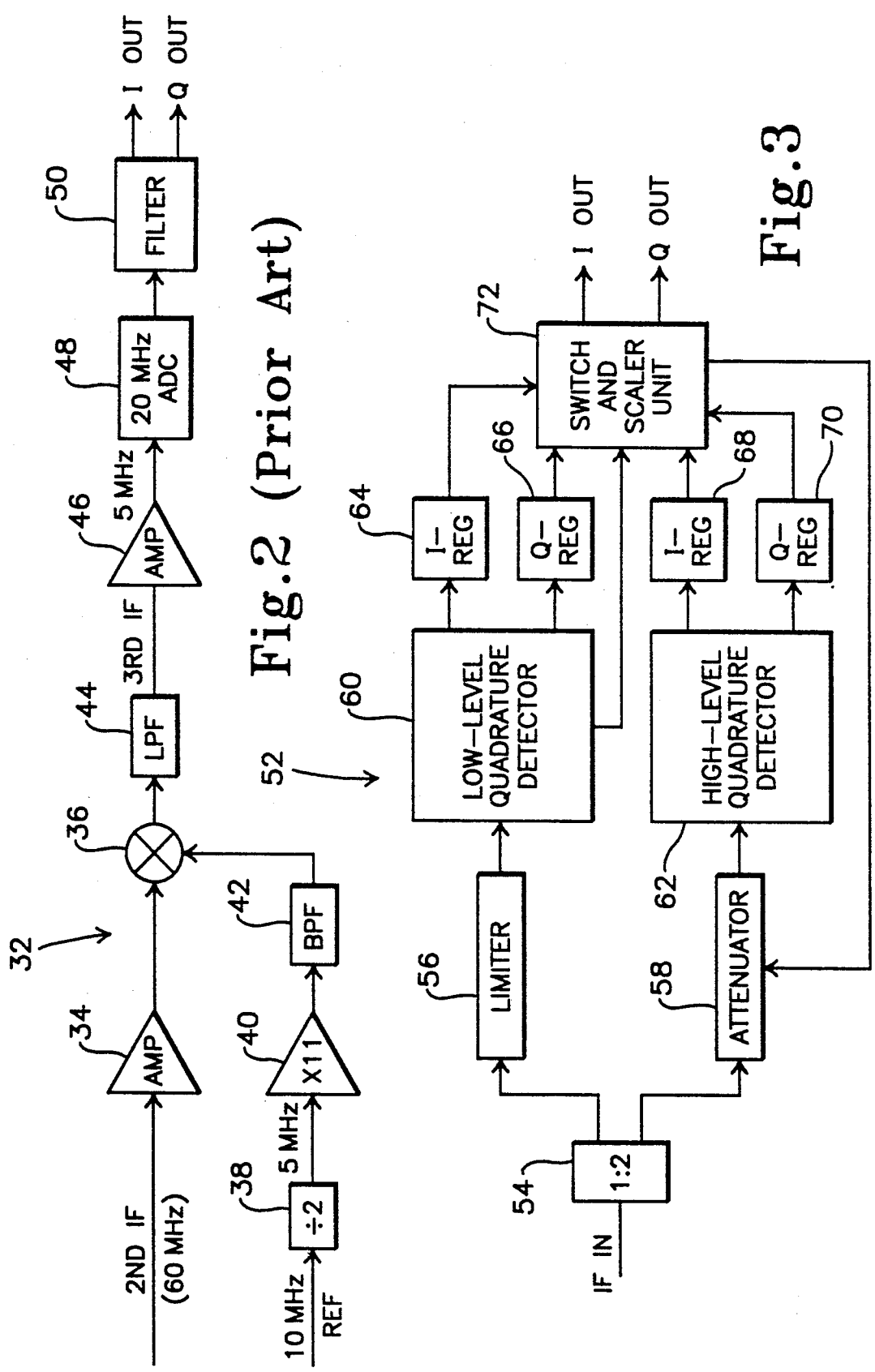

EXTENDED DYNAMIC RANGE QUADRATURE DETECTOR WITH PARALLEL CHANNEL ARRANGEMENT

BACKGROUND OF THE INVENTION

1. Field of the Invention

The present invention relates to a quadrature signal detector or demodulator which enables extended range operation using analog-to-digital converters having a relatively small number of bits.

2. Description of the Prior Art

Linear detection of intermediate frequency (IF) signals for coherent radar, sonar and communication systems is conventionally achieved using analog inphase and quadrature (I & Q) detectors or demodulators, which convert the IF signal to baseband signals on which phase detection is performed, or with more recently developed IF direct-digital-sampling (DDS) quadrature detectors which sample the IF signal directly at 90° time intervals using high speed analog-to-digital converters. Analog I & Q and DDS detectors are described, for example, in an article entitled "*A New Quadrature Sampling and Processing Approach*", by H. Liu et al, in *IEEE TRANSACTIONS ON AEROSPACE AND ELECTRONIC SYSTEMS*, vol. 25, no. 5, Sept. 1989, pp. 733–748.

FIG. 1 illustrates a conventional analog I & Q detector 10 including an input hybrid or signal splitter 12. The splitter 12 receives, for example, an analog IF bandpass signal IF IN from a coherent radar receiver (not shown), and splits the signal IF IN into two identical components which are fed to inphase and quadrature mixers 14 and 16. A 90° hybrid 18 receives a coherent reference signal COHO at the same frequency as the signal IF IN, and splits it into an inphase or SIN reference component which is applied to the mixer 14, and a quadrature or COS reference component which is applied to the mixer 16. The mixers 14 and 16 are typically double-balanced diode mixers, and produce at their outputs phase detected or demodulated inphase and quadrature analog baseband video signals respectively.

The analog inphase baseband signal is fed from the mixer 14 through a low pass filter 20 and amplifier 22 to an analog-to-digital converter 24 which samples the analog inphase baseband signal at periodic intervals and produces an inphase digital baseband video signal I OUT. The analog quadrature baseband signal is fed from the mixer 16 through a low pass filter 26 and amplifier 28 to an analog-to-digital converter 30 which samples the analog quadrature baseband signal at periodic intervals and produces a quadrature digital baseband video signal Q OUT. The amplitude information of the signal IF IN is represented by $(I^2+Q^2)^{\frac{1}{2}}$, and the phase information of the signal IF IN is represented by $\tan^{-1}(Q/I)$, where I and Q are the magnitudes of the signals I OUT and Q OUT respectively.

Analog I & Q detectors have inherent phase errors caused by imperfect quadrature matching of the hybrid components, and by DC offset errors present in even the best double-balanced diode mixer phase detectors. Video amplifier gain mismatches also contribute to I & Q amplitude imbalances which further degrade the resultant I & Q video signals from ideal quadrature.

The quadrature errors associated with analog I & Q detectors can be minimized by optimization of the detection circuitry components. Quadrature errors associated with the hybrids are minimized by phase "trimming" and careful selection of the components. DC offset errors are compensated for by external sensing and feedback circuitry. Variable gain control of video amplifier gain is required to minimize I & Q gain mismatches.

Deviations from ideal quadrature in the I & Q channels (I and Q imbalances) caused by phase and amplitude errors result in the generation of spectral images, which limit the performance of analog I & Q detectors. For minimum achievable phase and amplitude errors of 0.1° and 0.1% respectively, the spectral images of analog I % Q detectors are on the order of −60 dB. Thus, the usable dynamic range of analog I & Q detectors is limited to approximately 60 dB.

DDS detectors do not have the problems associated with analog I & Q detectors. DDS detectors obtain quadrature data by direct digital sampling of the IF signal at 90° time intervals using a high speed analog-to-digital converter, thus eliminating the IF to baseband conversion/detection functions, and their inherent phase and amplitude errors.

A typical DDS detector 32 is illustrated in FIG. 2 in an exemplary application as a detector in a coherent radar system (not shown). A 2ND IF signal at 60 MHz is applied through an amplifier 34 to a mixer 36. A reference signal REF at 10 MHz is divided by a frequency divider 38 having a division ratio of two to produce a 5 MHz signal which is applied to a multiplier 40 having a multiplication ratio of eleven. The resulting signal at 55 MHz is applied through a bandpass filter 42 to the mixer 36.

Mixing of the signals 2ND IF and REF (converted to 55 MHz) produces a 3RD IF signal at 5 MHz which is applied through a low pass filter 44 and amplifier 46 to an analog-to-digital converter 48. The converter 48 operates at 20 MHz (four times the frequency of the 3RD IF signal) to directly sample the 3RD IF signal and produce digital inphase and quadrature signals which are processed by a recursive or non-recursive Hilbert or other applicable filter 50 to produce the digital inphase and quadrature baseband signals I OUT and Q OUT.

The required sampling rate of DDS detectors is four times the IF frequency. Therefore, down conversion to a lower IF frequency is typically required to sample the IF signal directly using state of the art analog-to-digital converters. Because of the speed limitations of current analog-to-digital converters, DDS detectors have limited applications to systems with relatively narrow IF band-widths. For these systems, the DDS performance is limited by the resolution of the analog-to-digital converter and associated aperture uncertainty. The peak signal to RMS noise (dynamic range) of an analog-to-digital converter is determined by the number of bits N, and is approximately equal to $6(N-1)$. The maximum dynamic range of a DDS detector having a 12-bit analog-to-digital converter, for example, is 66 dB.

DDS detector performance is presently limited by analog-to-digital converter technology. Currently, the state of the art is 12-bit, 20 MHz analog-to-digital converters. Slower, 14-bit analog-to-digital converters which operate at 100 KHz are also available (to obtain higher dynamic range), but these converters cannot be used in DDS detectors for radar systems, which typically have IF bandwidths on the order of MHz. Thus, DDS detector dynamic range is presently limited to 66 dB.

The dynamic range of modern radar receivers must be commensurate with the range of signal levels encountered in present day scenarios. A typical scenario involves the detection of small target returns in the presence of large clutter or interference, typically on the order of 80 dB higher than the target. In order to process signals over such a wide signal range, receivers must achieve greater than 80 dB dynamic range from RF input to digital (I & Q) output.

SUMMARY OF THE INVENTION

The present invention overcomes the limitations of conventional analog I & Q and DDS detectors by providing identical low-level and high-level quadrature demodulators or detectors in parallel, each including high speed analog-to-digital converters with a relatively small number of bits. A signal limiter upstream of the low-level demodulator limits the amplitude of an input analog signal to a value corresponding to a predetermined signal level. An attenuator upstream of the high-level demodulator attenuates the input signal by a predetermined factor, so that the signal level into the high-level demodulator is correspondingly lower than the signal level into the low-level demodulator. When the amplitude of the input signal is below a predetermined value, a digital switching and scaling unit selects the output signals from the low-level demodulator and extends the digital output to a larger number of bits. When the amplitude of the input signal is above the value corresponding to the maximum amplitude handling capability of the low-level demodulator, the switching and scaling unit selects the output signals from the high-level demodulator, amplifies them by the predetermined scaling factor to restore their original amplitude, and extends the digital output to the larger number of bits. Thus, the dynamic range of a single detector is extended by a two-channel parallel detector scheme by a value corresponding to the attenuation/-scaling factor used. The demodulators may be of the analog or direct-digital-sampling type.

Although the analog-to-digital converters have a relatively small number of bits, (limited to 12 at the current state of the art), the present quadrature detector is able to operate over a dynamic range greater than 66 dB. Maximum resolution is attained for relatively small signals which are operated on in the low-level channel. Although the resolution is lower for larger signals operated on in the high-level channel due to the attenuation, the dynamic range is extended. Each 6 dB of attenuation in the high-level channel is comparable to increasing the capacity of the analog-to-digital converters by one bit, and extending the dynamic range by a corresponding 6 dB.

BRIEF DESCRIPTION OF THE DRAWINGS

FIG. 2 is a block diagram of a conventional DDS detector;

FIG. 3 is a block diagram of an extended range, quadrature detector embodying the present invention;

DETAILED DESCRIPTION OF PREFERRED EMBODIMENT

Figure 1:
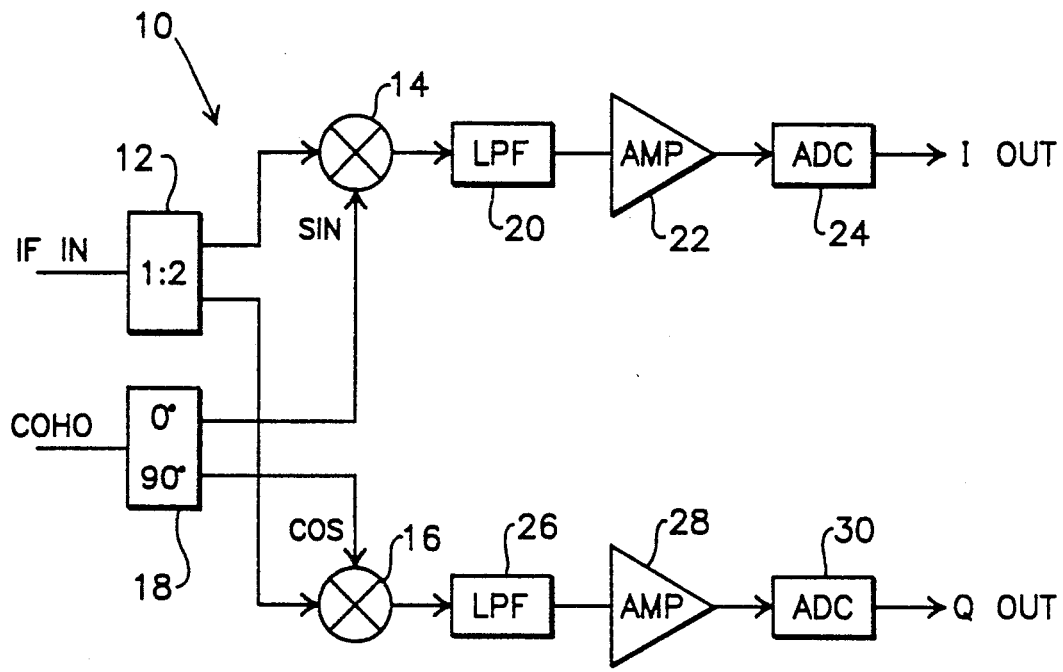
FIG. 1 is a block diagram of a conventional analog I & Q detector.

An extended dynamic range quadrature detector 52 embodying the present invention is illustrated in FIG. 3 and includes a splitter 54 for splitting a bandpass analog input signal IF IN into two equal components which are applied to a low-level channel including a limiter 56, and a high-level channel including an attenuator 58. The output of the limiter 56 is applied to a low-level quadrature demodulator or detector 60 which includes M-bit analog-to-digital converters which are not shown in FIG. 3, but which will be described in detail below with reference to FIGS. 5 and 6. The output of the attenuator 58 is applied to a high-level quadrature demodulator or detector 62 which may be identical to the detector 60. The quadrature detectors 60 and 62 may be of the analog I & Q type, the DDS type, or any other applicable type within the scope of the present invention. It is noted that when DDS type detectors are used, separate attenuators and limiters are required for the I and Q channels.

For exemplary purposes, it will be assumed that the number of bits M in the analog-to-digital converters of the detectors 60 and 62 is equal to 12. The low-level detector 60 produces 12-bit digital inphase and quadrature baseband low-level output signals which are temporarily stored in an I-register 64 and a Q-register 66 respectively. The high-level detector 62 produces 12-bit digital inphase and quadrature baseband low-level output signals which are temporarily stored in an I-register 68 and a Q-register 70 respectively. The outputs of the registers 64, 66, 68 and 70 are connected to inputs of a switch and scaler unit 72, which produces at its outputs N-bit digital inphase and quadrature baseband output signals I OUT and Q OUT.

In accordance with the principles of the present invention, N is larger than M. For exemplary purposes, it will be assumed that N is equal to 16. Whereas a 12-bit analog-to-digital converter capacity corresponds to a dynamic range of approximately 66 dB, a 16-bit capacity corresponds to a dynamic range of approximately 90 dB. As discussed above, a dynamic range of 80 dB is necessary to process signals in current radar scenarios. Extending the signal handling capacity from the current limit of 66 dB to 90 dB provides this capability.

The limiter 56 is optional, and is provided in applications where overdriving of the detector 60 would result in damage or other malfunction. The maximum signal output level of the limiter 56 is selected to correspond to a level slightly higher than the maximum input level of the detector 60. In the present example, the limiter 56 will limit the maximum amplitude of the analog input signal to a value corresponding to a dynamic range of 66 dB.

Figure 4:
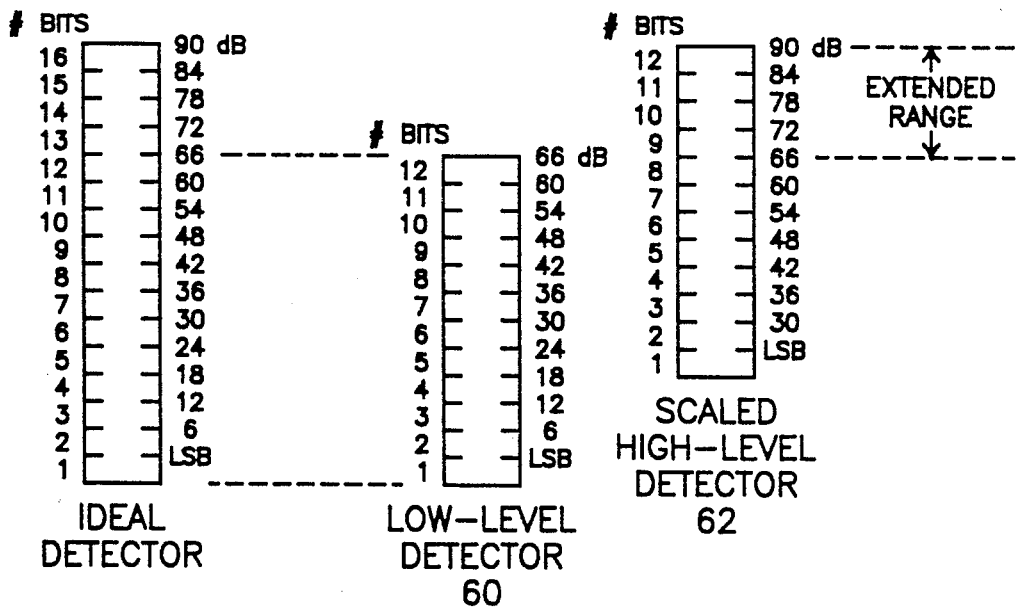
FIG. 4 is a diagram illustrating the operation of the present quadrature detector.

The attenuator 58 attenuates the analog input signal by a predetermined factor which may be fixed, or vary in accordance with a predetermined function of the maximum amplitude of the analog input signal IF IN. With reference being made also to FIG. 4, an ideal quadrature detector capable of processing signals having a maximum dynamic range of approximately 90 dB requires 16-bit analog-to-digital converters. As discussed above, 16-bit analog-to-digital converters capable of operating at radar receiver frequencies are not currently available.

The low-level detector 60 has a 12-bit capacity, and operates on relatively small signals within a dynamic range of 0 to 66 dB. In the example illustrated in FIG. 4, the attenuator 58 attenuates the analog input signal as applied to the high-level detector 62 by a factor of 24 dB. Although the analog-to-digital converters in the high-level detector 62 also have a 12-bit capacity, the 24 dB attenuation has the effect of increasing the signal handling capacity of the high-level detector 62 by 24 dB to obtain an effective overall dynamic range of 90 dB. Each 6 dB of attenuation has the effect of increasing the signal handling capacity of the high-level detector 62 by a corresponding 6 dB after proper scaling.

The switch and scaler unit 72 includes circuitry to digitally amplify or scale the output signals from the registers 68 and 70 by the same factor as the attenuation performed by the attenuator unit 58. This is accomplished by shifting the digital signals toward the most significant bit by one bit for each 6 dB of amplification desired. In order to restore the signals from the high-level detector 62 to their original level, a digital shift of 4 bits is required for a factor of 24 dB.

The switch and scaler unit 72 further includes circuitry to sense the amplitude of the analog input signal IF IN that saturates the low-level detector 60, and select the outputs of the registers 64 and 66 when the sensed amplitude is below the level which corresponds to the maximum dynamic range of the low-level detector 60. This corresponds, in the present example, to 66 dB. When the sensed amplitude of the signal IF IN exceeds the predetermined value, the switch and scaler unit 72 selects the outputs of the registers 68 and 70.

The switch and scaler unit 72 further includes circuitry for expanding the selected signals from either the detector 60 or the detector 62 from 12 bits to 16 bits to provide the N-bit output signals I OUT and Q OUT. When the sensed dynamic range of the signal IF IN is below 66 dB, the inphase and quadrature outputs of the low-level detector 60 will be selected, and the detector 52 will operate on IF IN signals with relative levels from 0 to 66 dB. When the relative level of the signal IF IN is above 66 dB (the maximum signal handling capacity or saturation level of the low-level detector 60), the inphase and quadrature outputs of the high-level detector 62 will be selected, and the detector 52 will operate on IF IN signals with relative levels from 66 to 90 dB. In the latter case, however, resolution of these signals is reduced by 24 dB, since the effective least significant bit of the high-level detector 62 is 24 dB higher than the least significant bit of the low-level detector 60.

A signal level in excess of the capacity of the analog-to-digital converters in the low-level detector 60 will produce an overflow or full-scale condition which can be easily sensed digitally. Thus, the switching circuitry in the unit 72 can be designed to select the outputs of the registers 64 and 66 in response to a non-overflow or not-0 full-scale condition in the detector 60 or registers 64 and 66, and the outputs of the registers 68 and 70 in response to an overflow or full-scale condition. The unit 72 may further be constructed to dynamically sense the maximum amplitude of the signal IF IN and vary the attenuation/amplification factor in accordance therewith. For example, the unit 72 may control the attenuator 58 to attenuate the signal IF IN by a factor of 6 dB for each 6 dB by which the signal IF IN exceeds 66 dB, and amplify the output signals from the registers 68 and 70 by 6 dB by shifting them by one bit toward the most significant bit for each 6 dB of attenuation.

Figure 5:
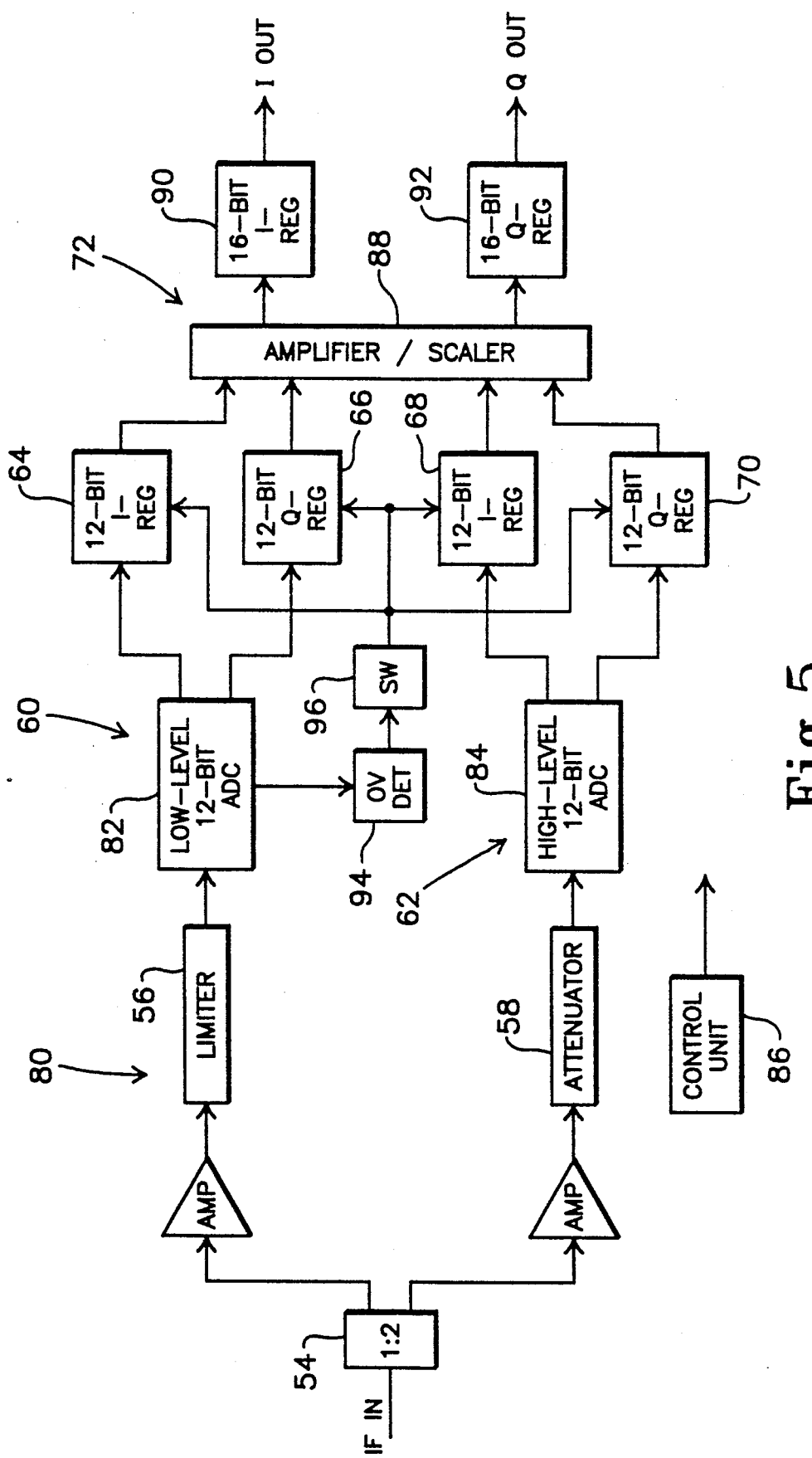
FIG. 5 is a block diagram of the present quadrature detector incorporating DDS demodulators.

FIG. 5 illustrates a quadrature detector 80 embodying the present invention utilizing DDS demodulators or detectors, in which like elements are designated by the same reference numerals used in FIG. 3. The low-level and high-level quadrature detectors 60 and 62 are DDS units including analog-to-digital converters 82 and 84. In the present example, the converters 82 and 84 have a capacity of 12-bits and operate at 20 MHz for an analog input signal IF IN having a frequency of (or converted to) 5 MHz. A control unit 86 generates clock and sequencing pulses which control the analog-to-digital converters 82 and 84 to digitally sample the analog baseband signals at 90° intervals in the manner described above with reference to FIG. 2. The low-level analog-to-digital converter 82 outputs 12-bit low-level inphase and quadrature signals to the registers 64 and 66, whereas the high-level analog-to-digital converter 84 outputs 12-bit high-level inphase and quadrature signals to the registers 68 and 70 respectively. The outputs of the registers 64, 66, 68 and 70 are applied to a digital amplifier/scaler 88, which amplifies the outputs of the registers 68 and 70 by the attenuation/amplification factor and extends the digital signals from 12-bits to 16-bits to produce the N-bit output signals I OUT and Q OUT which are stored in 16-bit registers 90 and 92 for further processing.

The analog-to-digital converter 82 has an overflow output which is connected to an overflow detector 94 which controls a switch 96. In response to a non-overflow condition (signal level below 66 dB), the switch 96 enables the outputs of the registers 64 and 66 and inhibits the outputs of the registers 68 and 70, such that the low-level output signals are only digitally extended and stored in the registers 90 and 92. In response to a sensed overflow condition in the analog-to-digital converter 60 (signal dynamic range above 66 dB), the switch 96 enables the outputs of the registers 68 and 70 and inhibits the outputs of the registers 64 and 66 such that the high-level signals are amplified or scaled up, digitally extended and stored in the registers 90 and 92.

Although the switch 96 is illustrated as controlling the outputs of the registers 64, 66, 68 and 70, it is within the scope of the invention to have the registers produce continuous outputs, and adapt the switch 96 to control the scaler 88 to select only the desired outputs. Further, it is within the scope of the invention to adapt the detector 94 to control the attenuation/amplification factor of the attenuator 58 and scaler 88 in an incremental rather than two-state manner.

Figure 6:
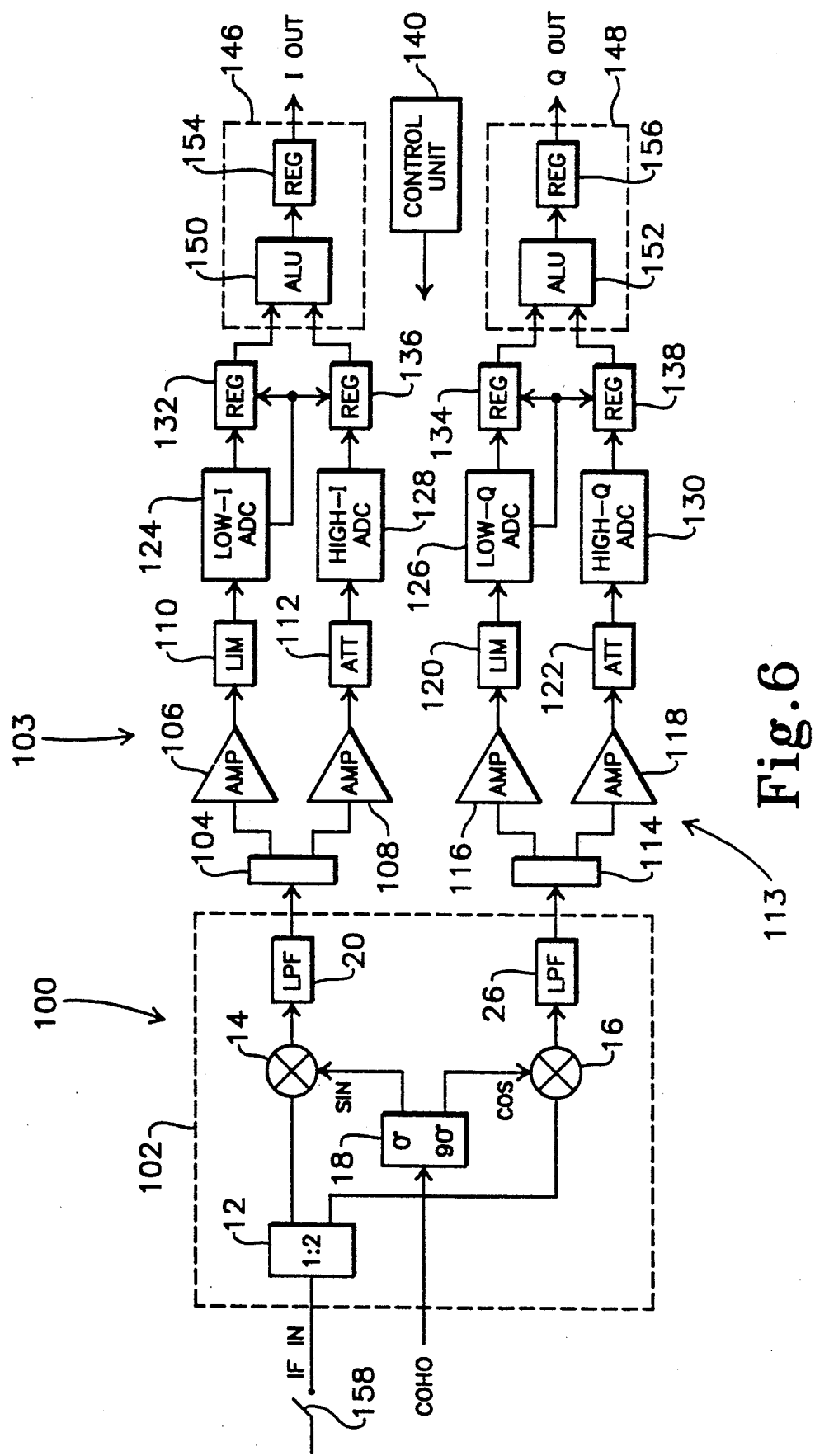
FIG. 6 is a block diagram of the present quadrature detector incorporating analog I & Q demodulators.

FIG. 6 illustrates a quadrature detector 100 embodying the present invention utilizing analog I & Q detectors. The detector 100 includes a basic I & Q demodulator section 102 including the splitter 12, balanced mixers 14 and 16, hybrid 18, and low pass filters 20 and 26 which were described above with reference to FIG. 1 and perform the same functions in the detector 100.

The inphase analog baseband signal from the filter 20 is applied to an inphase channel 103 through a splitter 104 and amplifiers 106 and 108 to a limiter 110 and an attenuator 112, respectively. The quadrature analog baseband signal is applied to a quadrature channel 113 through a splitter 114 and amplifiers 116 and 118 to a limiter 120 and attenuator 122, respectively. The outputs of the limiters 110 and 120 constitute low-level analog baseband inphase and quadrature signals which are applied to 12-bit low-level analog-to-digital converters 124 and 126 respectively. The attenuators 112 and 122 provide attenuation by a predetermined factor in the manner described above, and produce at their outputs high-level analog baseband inphase and quadrature signals which are applied to 12-bit high-level analog-to-digital converters 128 and 130 respectively. The outputs of the analog-to-digital converters 124, 126, 128 and 130 are periodically sampled and stored in registers 132, 134, 136 and 138 respectively under control of signal pulses from a control unit 140.

The analog-to-digital converters 124 and 126 have overflow or full-scale outputs 142 and 144 connected to control the registers 132,136, and 134,138 respectively. If the relative level of the signal IF IN is below 66 dB, the converters 124 and 126 do not produce overflow or fullscale signals, the outputs of the registers 132 and 134 are enabled, and the outputs of the registers 136 and 138 are inhibited. If the relative level of the signal IF IN is above 66 dB (or the corresponding saturation level of the converters), the converters 124 and 126 produce overflow or full-scale signals, the outputs of the registers 136 and 138 are enabled, and the outputs of the registers 132 and 134 are inhibited.

The low-level digital inphase and quadrature signals from the registers 132 and 134 are applied to digital amplifier and scaling units 146 and 148 respectively when the amplitude of the signal IF IN is below the level that saturates the low-level converters 124 and 126, and the high-level digital inphase and quadrature signals from the registers 136 and 138 are applied to the digital amplifier and scaling units 146 and 148 respectively when the amplitude of the signal IF IN is at or above the level that saturates the low-level converters 124 and 126. The units 146 and 148 have circuitry including arithmetic logic units (ALUs) 150 and 152, and 16-bit registers 154 and 156 for storing the scaled-up digital inphase and quadrature baseband signals I OUT and Q OUT respectively. The arithmetic logic units 150 and 152 are constructed to provide the 12-bit to 16-bit scaling operation, as well as amplifying the high-level signals from the registers 136 and 138 by the attenuation/amplification factor prior to scaling.

In addition, the ALUs are used to dynamically calibrate out DC offsets present in the mixers 14 and 16 and amplifiers 106, 108, 116 and 118, as well as to compensate for DC level variations due to temperature effects. This is done by removing the IF IN signal from the detector by opening a switch 158 and subtracting the corresponding offset outputs from the signal outputs obtained with the normally closed switch 158.

Since the principles of the invention have now been made clear, modifications which are particularly adapted for specific situations without departing from these principles will be apparent to those skilled in the art. The appended claims are intended to cover such modifications as well as the subject matter described and to only be limited by the true spirit and scope of the invention.

What is claimed as new and desired to be secured by Letters Patent of the United States is:

1. A quadrature detector for producing N-bit digital inphase and quadrature baseband output signals in response to an analog input signal, comprising:
   low-level quadrature demodulator means responsive to the input signal, including low-level analog-to-digital converter means for quadrature sampling the input signal and producing M-bit digital inphase and quadrature baseband low-level output signals in response thereto, where M is less than N;
   high-level quadrature demodulator means responsive to the input signal, including:
   signal attenuating means for attenuating the input signal by a predetermined factor; and
   high-level analog-to-digital converter means for quadrature sampling the attenuated input signal and producing M-bit digital inphase and quadrature baseband high-level output signals in response thereto; and
   digital scaling and switching means including:
      digital amplifier means for amplifying or scaling the high-level output signals by said predetermined factor;
      digital bit extension means for extending the number of bits of the low-level digital output signals or the amplified high-level digital output signals to produce the N-bit output signals; and
      switching means for detecting the amplitude of the input signal and applying the low-level digital output signals to the bit extension means when said amplitude is below a predetermined value that saturates the low-level analog-to-digital converter, and applying the amplified high-level digital output signals to the bit extension means when said amplitude is above said predetermined value.

2. A detector as in claim 1, in which the low-level quadrature demodulator means further comprises s i g n a l limiting means for limiting the maximum amplitude of the input signal to slightly above said predetermined value.

3. A detector as in claim 2, in which said predetermined value corresponds to the dynamic signal range of the low-level analog-to-digital converter means.

4. A detector as in claim 1, in which:
   the low-level quadrature demodulator means includes low-level analog inphase and quadrature demodulator means; and
   the high-level quadrature demodulator means includes high-level analog inphase and quadrature demodulator means.

5. A detector as in claim 4, in which:
   the low-level and high-level analog inphase and quadrature demodulator means in combination include:
   inphase signal mixer means;
   quadrature signal mixer means;
   input signal splitting means for applying the input signal to the inphase and quadrature mixer means;
   input switch means for selectively applying or not applying the input signal to the input signal splitting means;
   reference signal hybrid means for applying inphase and quadrature components of a reference signal to the inphase and quadrature mixer means respectively;
   the inphase and quadrature signal mixer means producing inphase and quadrature analog baseband signals respectively;
   inphase signal splitting means for splitting the inphase analog baseband signal into low-level and high-level inphase channels respectively; and
   quadrature signal splitting means for splitting the quadrature analog baseband signal into low-level and high-level quadrature channels respectively;
   the low-level analog-to-digital converter means includes:
   inphase low-level analog-to-digital converter means disposed in the low-level inphase channel; and quadrature low-level analog-to-digital converter means disposed in the low-level quadrature channel;

the signal attenuating means includes:
  inphase signal attenuating means disposed in the high-level inphase channel; and
  quadrature signal attenuating means disposed in the high-level quadrature channel;

the high-level analog-to-digital converter means includes:
  inphase high-level analog-to-digital converter means disposed in the high-level inphase channel downstream of the inphase signal attenuating means; and
  quadrature high-level analog-to-digital converter means disposed in the high-level quadrature channel downstream of the quadrature signal attenuating means; and the switching means includes:
  inphase switching means for selecting the output of the inphase low-level analog-to-digital converter means when said amplitude of the input signal is below said predetermined value, and selecting the output of the inphase high-level analog-to-digital converter means when said amplitude is above said predetermined value; and
  quadrature switching means for selecting the output of the quadrature low-level analog-to-digital converter means when said amplitude of the input signal is below said predetermined value, and selecting the output of the quadrature high-level analog-to-digital converter means when said amplitude is above said predetermined value.

6. A detector as in claim 5, in which the low-level quadrature demodulator means further comprises signal limiting means for limiting said maximum amplitude of the input signal to a level slightly above said predetermined value, including:
  inphase signal limiting means disposed in the low-level inphase channel; and
  quadrature signal limiting means disposed in the low-level quadrature channel.

7. A detector as in claim 1, in which:
  the low-level analog-to-digital converter means includes low-level direct-digital-sampling inphase and quadrature demodulator means; and
  the high-level analog-to-digital converter means is disposed between the signal attenuating means and the scaling and switching means and includes high-level direct-digital-sampling inphase and quadrature demodulator means.

8. A detector as in claim 7, in which the low-level quadrature demodulator means further comprises signal limiting means disposed upstream of the low-level analog-to-digital converter means for limiting said maximum amplitude of the input signal to a level slightly above said predetermined value.

9. A detector as in claim 1, in which the switching means is further constructed to detect said amplitude of the input signal and control the attenuating means and amplifier means to vary said predetermined factor as a predetermined function of said amplitude.

10. A detector as in claim 9, in which the switching means is further constructed to dynamically increase said predetermined factor as said amplitude of the input signal increases.

11. A detector as in claim 1, further comprising:
  input switch means for selectively applying or not applying the input signal to the low-level quadrature demodulator means and high-level quadrature demodulator means; and
  DC offset compensation means for removing DC offsets from the quadrature detector by subtracting output signals produced when the input signal is not applied to the low-level quadrature demodulator means and high-level quadrature demodulator means from output signals produced when the input signal is applied to the low-level quadrature demodulator means and high-level quadrature demodulator means.

* * * * *